(12) United States Patent
Sobolewski

(10) Patent No.: US 7,616,014 B1
(45) Date of Patent: Nov. 10, 2009

(54) PULSED I-V MEASUREMENT METHOD AND APPARATUS

(75) Inventor: Gregory Sobolewski, Seven Hills, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 233 days.

(21) Appl. No.: 11/703,931

(22) Filed: Feb. 8, 2007

(51) Int. Cl.
*G01R 27/08* (2006.01)
*G01R 31/26* (2006.01)
*H01L 23/58* (2006.01)

(52) U.S. Cl. .......................... 324/718; 324/769; 257/48
(58) Field of Classification Search ................. 324/713, 324/718, 765–769; 257/48
See application file for complete search history.

(56) References Cited

U.S. PATENT DOCUMENTS 5,648,920 A * 7/1997 Duvvury et al. ............... 716/20
5,905,384 A * 5/1999 Inoue et al. .................. 324/769
6,998,869 B2 * 2/2006 Tanida et al. ................. 324/765
7,242,200 B2 * 7/2007 Okawa ........................ 324/713

OTHER PUBLICATIONS

Efficient Microwave Bias and Testing Using the HP 4142B Modular DC Source/Monitor. Hewlett Packard. Application Note 1205 (Date: At least as early as Aug. 30, 2006.).

* cited by examiner

*Primary Examiner*—Timothy J Dole
(74) *Attorney, Agent, or Firm*—Pearne & Gordon LLP

(57) ABSTRACT

A method and apparatus for measuring a pulsed I-V characteristic of a DUT that has a signal terminal and a return terminal includes connecting a pulse unit between the signal and return terminals, the pulse unit having a pulse source and a pulsed current measuring device; pulsing the signal terminal with the pulse unit; measuring a pulsed current through the signal terminal with the current measuring device in response to the pulsing; and outputting, storing, displaying, or otherwise using the current measurement.

8 Claims, 3 Drawing Sheets

PULSED I-V MEASUREMENT METHOD AND APPARATUS

BACKGROUND OF THE INVENTION

The present invention relates to pulsed measurements and, in particular, to the measurement of I-V characteristics for semiconductor devices.

It is well-known to characterize semiconductor devices according to their I-V curves and similar measurements. Historically, such measurements are made with DC signals applied and measured. However, these DC measurements are not always suitable. For example, in many cases, these DC measurements result in significant heating of the devices resulting in measurements with little value.

To help minimized such issues, techniques that provide a DC bias to the device under test (DUT) in combination with a pulsed input signal have been used. These techniques employ additional circuitry to separate the DC signals from the pulsed signals. However, this circuitry can cause its own issues, in particular bandwidth limitations and calibration difficulties.

SUMMARY OF THE INVENTION

A method and apparatus for measuring a pulsed I-V characteristic of a DUT that has a signal terminal and a return terminal includes connecting a pulse unit between the signal and return terminals, the pulse unit having a pulse source and a pulsed current measuring device; pulsing the signal terminal with the pulse unit; measuring a pulsed current through the signal terminal with the current measuring device in response to the pulsing; and outputting, storing, displaying, or otherwise using the current measurement.

DESCRIPTION OF THE PREFERRED EMBODIMENTS

Figure 1:
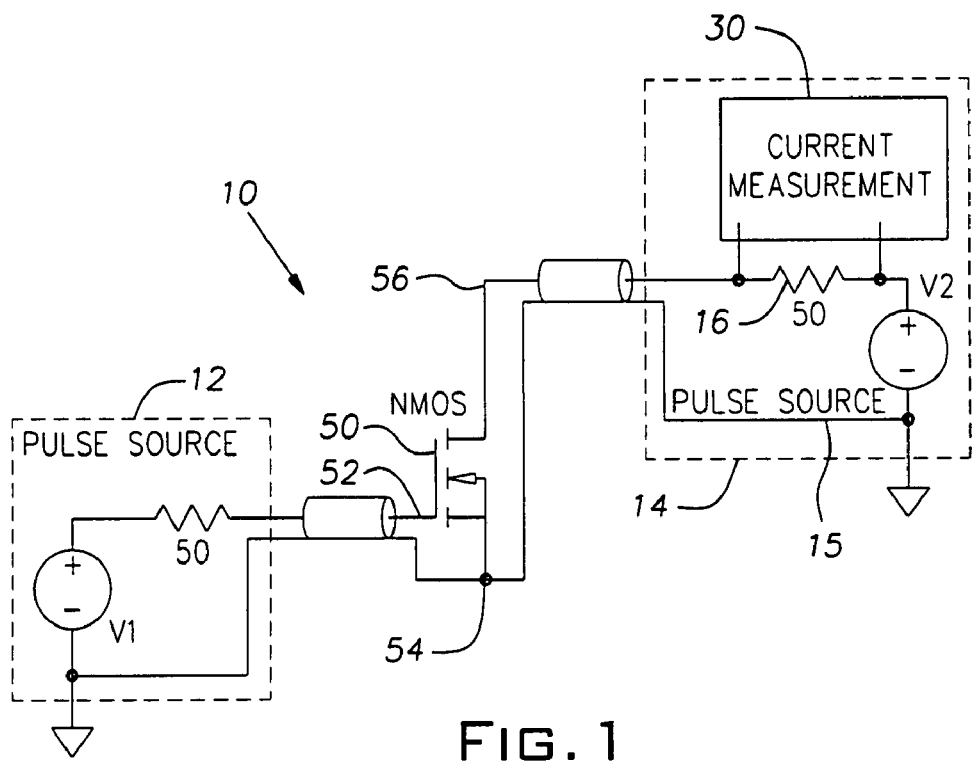
FIG. 1 is a schematic diagram of an example according to the invention.

Referring to FIG. 1, an apparatus 10 is used for measuring a pulsed I-V characteristic of a DUT 50. A first pulse unit 12 is connected between a first terminal 52 and a second terminal 54 of the DUT 50. A second pulse unit 14 is connected between the second terminal 54 and a third terminal 56 of the DUT 50. The first terminal 52 is a control terminal in that signals applied to the terminal 52 control the current into the terminal 56. The second pulse unit 14 includes a pulse source 15 and a pulsed current measurement device 30.

The DUT 50 may be, for example, a MOSFET or other three terminal device of interest.

In the example shown, the current measurement is based on the voltage drop across the load resistance 16 of the pulse unit 14, but a separate sense resistance may be used.

When the pulse units 12, 14 are pulsed, a current results through the resistance 16. This current is a function of the pulse characteristics of the pulses from the pulse units 12, 14 and can then be used to determine a pulse I-V characteristic, i.e., current values for various pulse values.

Typically, the apparatus 10 would be operated under the control of a computer, or the like, which would automatically adjust the pulse parameters (e.g., amplitude and pulse width) between desired values and combine these applied parameters with the measured current to output, store, display, or otherwise use the desired pulse I-V characteristics of the DUT.

Figure 2:
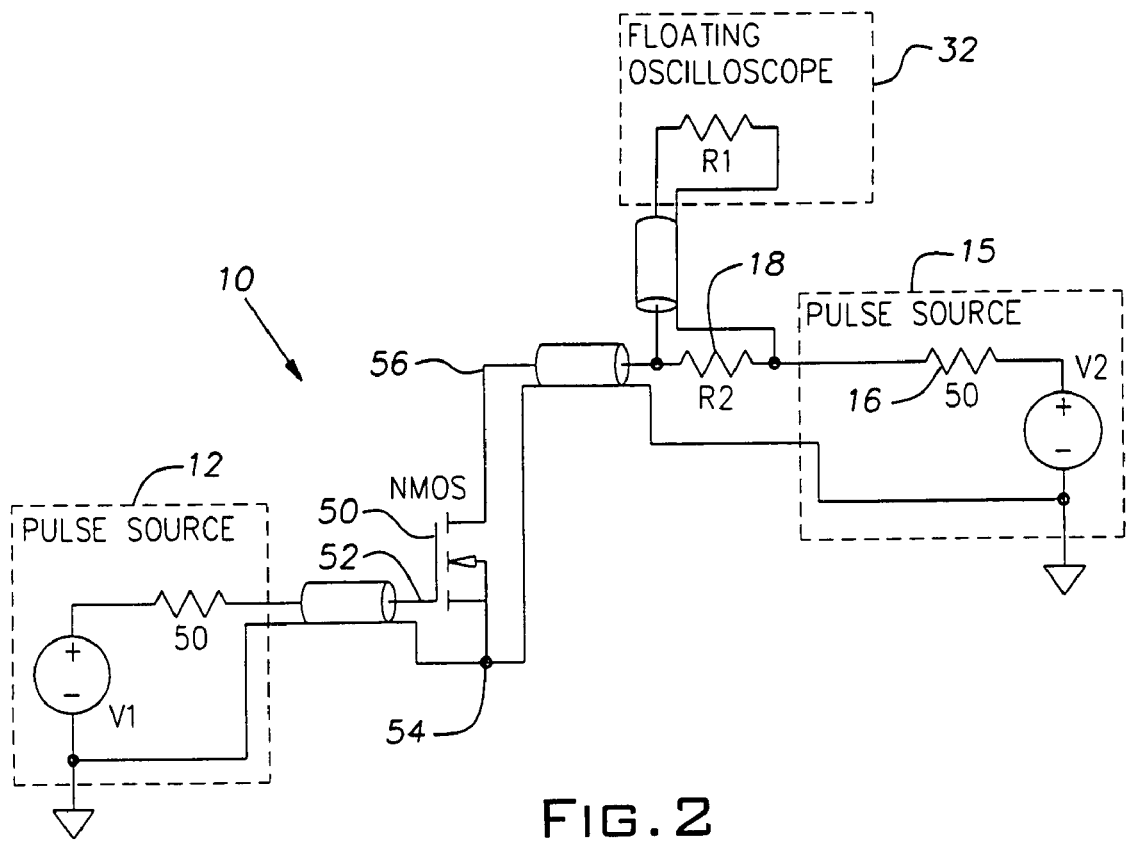
FIG. 2 is a schematic diagram of another example according to the invention.

Referring to FIG. 2, the current measurement device 30 of FIG. 1 may be implemented as a floating oscilloscope 32. The term floating means that the device is not affected by common mode voltages, the current measurement is just representative of the current into the terminal 56. This oscilloscope is not affected by common mode voltage that would degrade the desired current measurement. In this example, the current for the I-V measurement is measured by the voltage drop across a sense resistor 18.

It is also possible to substitute other pulsed current measurement devices for the oscilloscope 32 (also floating in this case), for example, a waveform digitizer.

Figure 3:
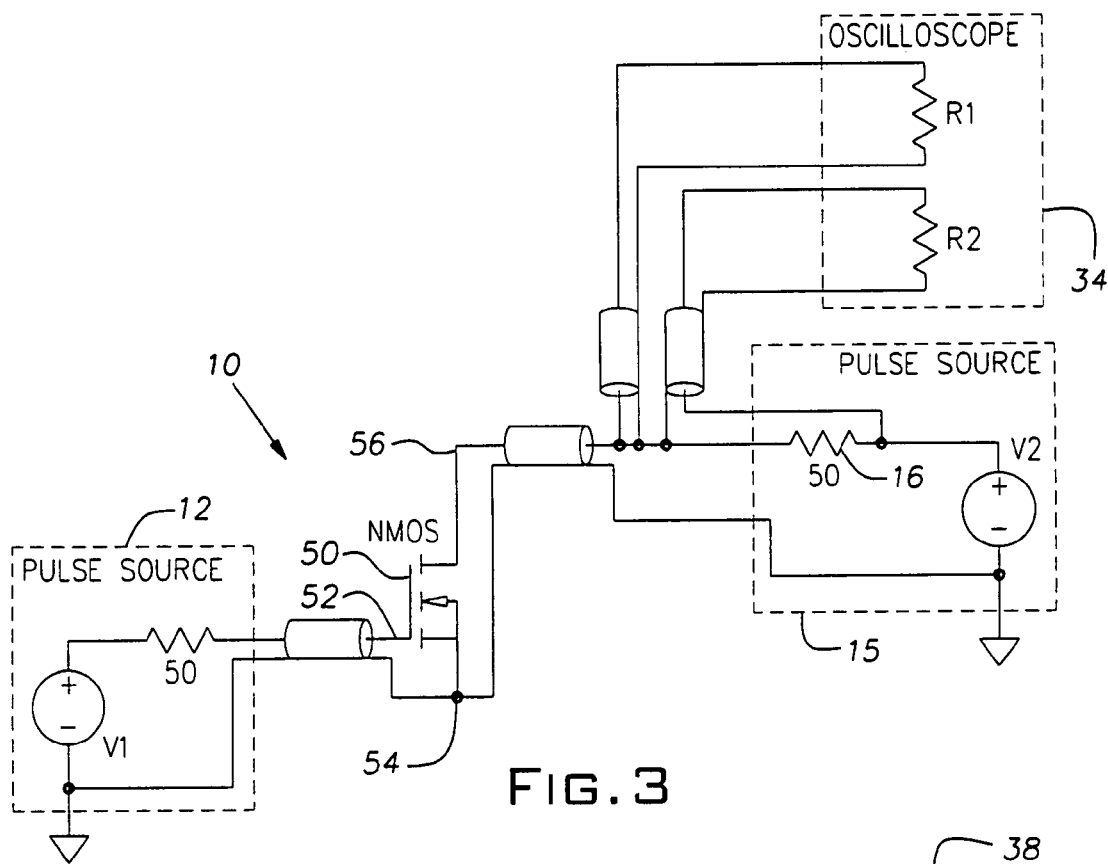
FIG. 3 is a schematic diagram of still another example according to the invention.

Referring to FIG. 3, the current measurement device 30 of FIG. 1 may be implemented with a differential oscilloscope 34 to cancel out common mode voltages in the oscilloscope to effectively float the oscilloscope with respect to measured signals.

Figure 4:
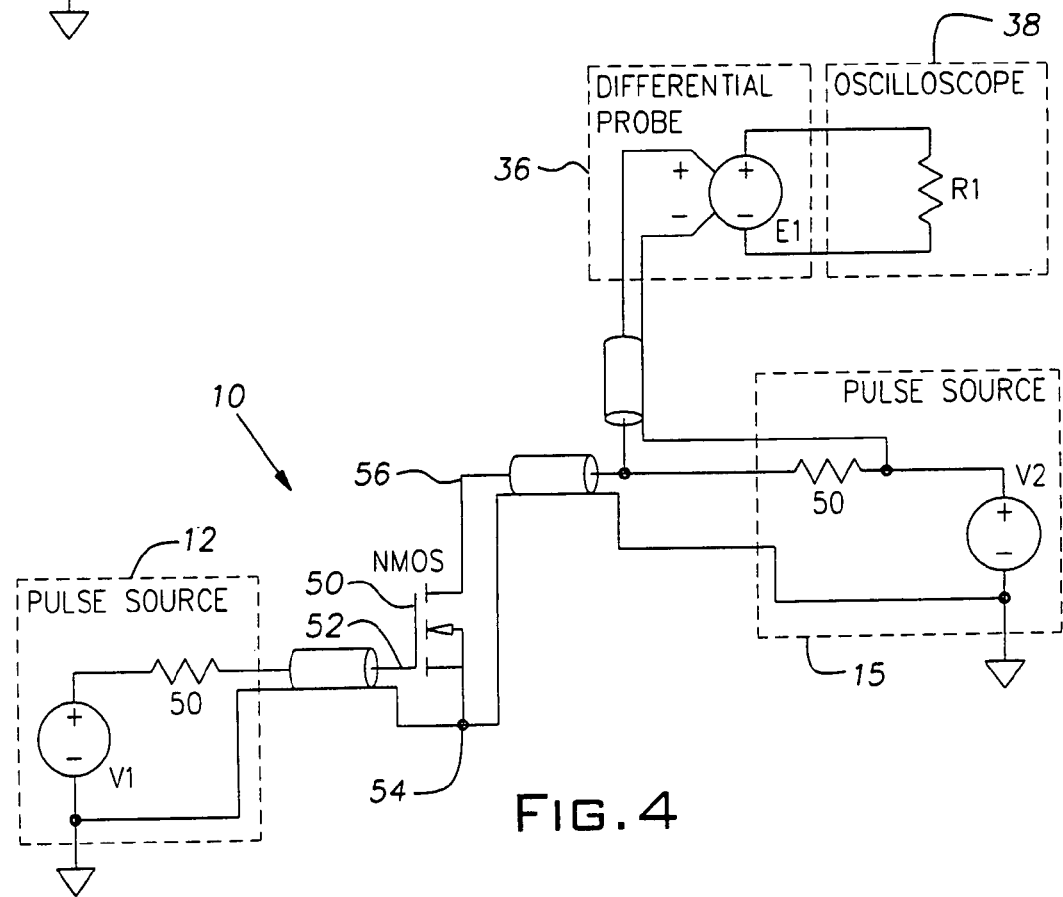
FIG. 4 is a schematic diagram of an additional example according to the invention.

Referring to FIG. 4, the current measurement device 30 of FIG. 1 may be implemented with a differential probe 36 that cancels common mode voltages in combination with an oscilloscope 38 that is not necessarily a floating oscilloscope.

Figure 5:
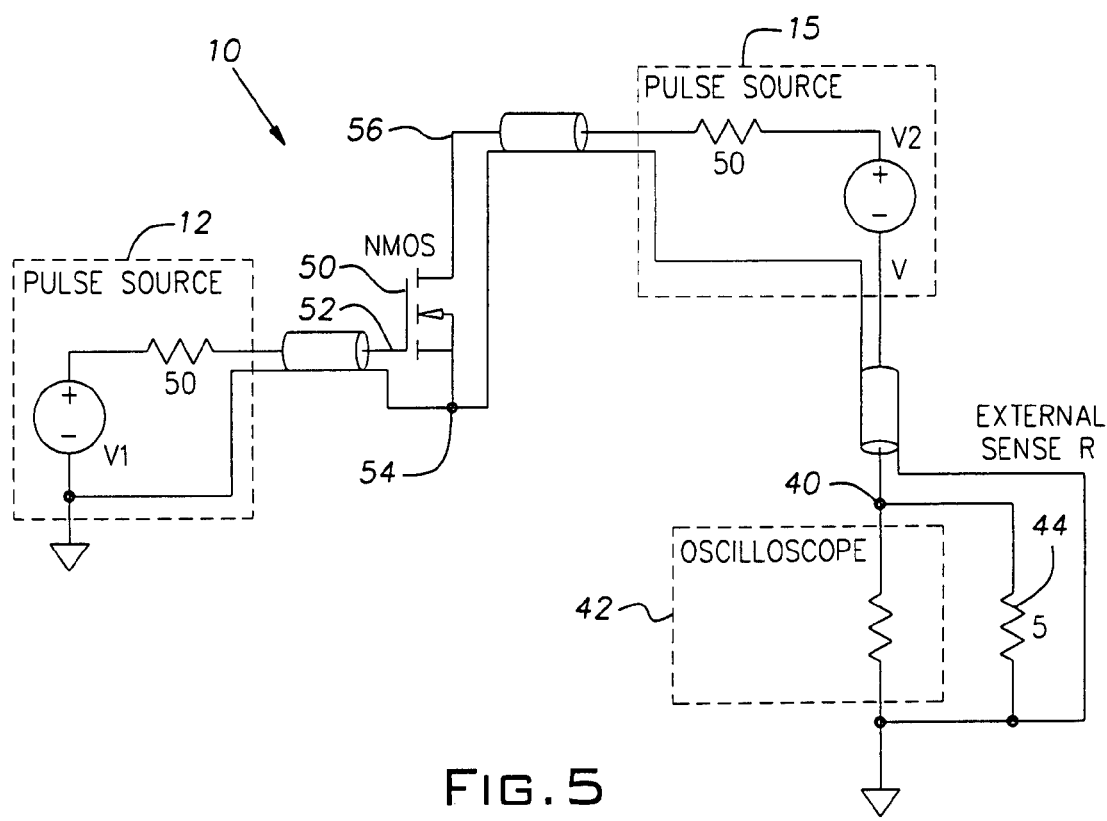
FIG. 5 is a schematic diagram of another additional example according to the invention.

Referring to FIG. 5, another implementation of the pulse unit 14 has the pulse source 15 floating on an input terminal 40 of an oscilloscope 42. Because all the voltage and current of the pulse source 15 is with respect to the terminal 40, common mode voltage in the oscilloscope 42 is not measured. As a practical matter, a sense resistor 44 is provided across the oscilloscope 42 to lower the effective input impedance.

The invention has been discussed above with respect to three-terminal devices where two terminals are pulsed by respective pulse units. However, the invention is also applicable to the case where the pulse unit 12 is not present, not connected, or not operated. In this case, only two terminals on the DUT 24 are used during a measurement of interest. The DUT may, in fact, only have two terminals. For example, the terminal 56 may be considered a signal terminal and the terminal 54 may be considered a return terminal. The operation of the apparatus 10 in this case is essentially the same, except that the pulse unit 12 is not operated and thus does not a factor in the measurements.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for measuring a pulsed I-V characteristic of a DUT having a signal terminal and a return terminal, said method comprising:

connecting a pulse unit between said signal and return terminals, said pulse unit having a pulse source and a pulsed current measuring device;

pulsing said signal terminal with said pulse unit;

measuring a pulsed current through said signal terminal with said current measuring device in response to said pulsing; and outputting, storing, displaying, or otherwise using said current measurement, wherein said pulse source comprises said pulse source floating on said pulsed current measurement device.

2. A method according to claim 1, wherein said pulsed current measuring device includes an oscilloscope.

3. An apparatus for measuring a pulsed I-V characteristic of a DUT having a signal terminal and a return terminal, said apparatus comprising:

a pulse unit adapted to be connected between said signal and return terminals, said pulse unit having a pulse source and a pulsed current measuring device, whereby:

pulsing said signal terminal with said pulse unit; and measuring a pulsed current through said signal terminal with said current measuring device in response to said pulsing results in outputting, storing, displaying, or otherwise using said current measurement, wherein said pulse source comprises said pulse source floating on said pulsed current measurement device.

4. An apparatus according to claim 3, wherein said pulsed current measuring device includes an oscilloscope.

5. A method for measuring a pulsed I-V characteristic of a DUT having a first terminal, a second terminal and a third terminal, said first terminal being a control terminal, said method comprising:

connecting a first pulse unit between said first and second terminals;

connecting a second pulse unit between said second and third terminals, said second pulse unit having a pulse source and a pulsed current measuring device;

pulsing said first terminal with said first pulse unit;

pulsing said third terminal with said second pulse unit;

measuring a pulsed current through said third terminal with said current measuring device in response to said pulsing steps; and outputting, storing, displaying, or otherwise using said current measurement, wherein said second pulse unit comprises said pulse source floating on said pulsed current measurement device.

6. A method according to claim 5, wherein said pulsed current measuring device includes an oscilloscope.

7. An apparatus for measuring a pulsed I-V characteristic of a DUT having a first terminal, a second terminal and a third terminal, said first terminal being a control terminal, said apparatus comprising:

a first pulse unit adapted to be connected between said first and second terminals;

a second pulse unit adapted to be connected between said second and third terminals, said second pulse unit having a pulse source and a pulsed current measuring device, whereby:

pulsing said first terminal with said first pulse unit;

pulsing said third terminal with said second pulse unit; and measuring a pulsed current through said third terminal with said pulsed current measuring device in response to said pulsing steps results in outputting, storing, displaying, or otherwise using said current measurement, wherein said second pulse unit comprises said pulse source floating on said pulsed current measurement device.

8. An apparatus according to claim 7, wherein said pulsed current measuring device includes an oscilloscope.

* * * * *